(12) United States Patent
Lee et al.

(10) Patent No.: US 6,268,252 B1
(45) Date of Patent: Jul. 31, 2001

(54) METHOD OF FORMING SELF-ALIGNED CONTACT PADS ON ELECTRICALLY CONDUCTIVE LINES

(75) Inventors: Jae-Goo Lee; Chang-Hyun Cho, both of Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/442,523

(22) Filed: Nov. 18, 1999

(30) Foreign Application Priority Data

Nov. 20, 1998 (KR) .................................................. 98-49959

(51) Int. Cl.$^7$ ................................................ H01L 21/336
(52) U.S. Cl. ............................................ 438/299; 438/229
(58) Field of Search ................................. 438/229, 299, 438/733, 734, 735, 738, 745, 629, 634, 637, 638, 639, 640, 666, 672, 667, 668

(56) References Cited

U.S. PATENT DOCUMENTS

| | | | |
|---|---|---|---|
| 4,992,848 | 2/1991 | Chin et al. | 357/68 |
| 5,902,132 | * 5/1999 | Mitsuhashi | 438/666 |
| 6,010,935 | * 1/2000 | Doan | 438/303 |
| 6,018,184 | * 1/2000 | Becker | 257/368 |
| 6,057,581 | * 5/2000 | Doan | 257/401 |

OTHER PUBLICATIONS

Kohyama et al., A Fully Printable, Self–aligned and Planarized Stacked Capacitor DRAM Cell Technology for Igbit DRAM and Beyond, 1997 Symposium on VLSI Technology Digest of Technical Papers, 1997, pp. 17–18.
Sim et al., A New Planar Stacked Technology (PST) for Scaled and Embedded DRAMs, IEDM, 1996, pp. 597–600.
Lee et al., A Process Technology for 1 Giga–Bit DRAM, IEDM, 1995, p. 907.

* cited by examiner

Primary Examiner—David Nelms
Assistant Examiner—David Nhu
(74) Attorney, Agent, or Firm—Myers Bigel Sibley & Sajovec

(57) ABSTRACT

Self aligned contact pads in a semiconductor device and a method for forming thereof wherein etching back process is carried out on the contact pad comprising material and insulating layer down to the top surface of a capping layer of a gate electrode, and also portions of the capping layer is selectively etched with respect to the contact pad composing material at the end of the etching back process and thereby forming the contact pads to be electrically separated from each other. SAC is opened by etching insulating layer selectively to the capping layer using SAC gate mask. A conductive material as for SAC pad is deposited over the insulating layer to fill the SAC opening. Etching back process is carried out to form the SAC pad.

8 Claims, 4 Drawing Sheets

METHOD OF FORMING SELF-ALIGNED CONTACT PADS ON ELECTRICALLY CONDUCTIVE LINES

BACKGROUND OF THE INVENTION

1. Field of the Invention

The present invention relates to a semiconductor device manufacturing, and more particularly to a self aligned contact pad and a method for forming thereof.

2. Description of the Related Art

Recently, with the advance of semiconductor technique, a trend toward smaller design rules for semiconductor devices such as Gbit scale DRAMs has proceeded to the extend that alignment margin can hardly be secured when aligning a contact plug with a semiconductor layer or interconnect layer underlying the contact plug. Accordingly, for sub-quarter micron semiconductor devices, a manufacturing process is employed which permits the contact plug to be formed by self alignment with a semiconductor layer or interconnect layer underlying the contact plug. U.S. Pat. No. 4,992,848 disclosed self aligned contact process the disclosure of which is incorporated herein by reference.

Advantages of the self aligned contact(hereinafter referred to "SAC") are as follows. First, the alignment margin for contact opening formation by photographic process can be increased. Second, the contact resistance can be reduced because all the areas defining the contact opening can be used in contact areas. For these reasons, emphasis has been place upon the SAC technique.

IEDM '95, p.907 and IEDM '96, p.597, the disclosures of which are incorporated herein by reference, disclosed SAC process wherein SAC patterns resemble circle type or eclipse type, storage node contact opening and bit line contact opening are formed in the thick insulating layer, separately, i.e., spaced apart from each other.

As is well known, as the device pattern size becomes smaller, i.e., as the aspect ratio of the contact hole becomes high, the area which is to be etched reduces and the depth of the contact hole increases. As a result, during the step of etching the thick insulating layer, etching byproducts cannot easily diffuse out from such deep and narrow openings thereby reducing etching rate. In severe case, etching rate significantly reduces and etching can be ceased, i.e., so called etch stop phenomenon.

To solve the etch stop phenomenon, the etching must be performed under the condition that formation of the by-product such as polymer is suppressed and the etching time must be increased. However, in case of such etching condition, since etching selectivity between layer to be etched and another stopper becomes poor, the gate capping layer and gate spacer can be also etched during the SAC etching, thereby resulting in an electrical bridge between the SAC pad and gate electrode.

Y.Kohyama et al, has proposed a method for forming SAC pad, wherein the SAC openings for storage node and bit line are merged together, in the article entitled "A Fully Printable, Self-aligned and Planarized Stacked Capacitor DRAM Cell Technology for 1 Gbit DRAM and Beyond", symp, on VLSI tech, digest of technical papers, pp. 17–18, 1997, the disclosure of which is incorporated herein by reference.

In this method, the gate SAC pattern (which indicates resist area) is the same as active area and is shifted by a half pitch to gate direction. Therefore, the photoresist pattern area is so small that the polymer formation is very low during the step of SAC etching. As a result, etching selectivity between the insulating layer and the nitride layer of gate spacer and gate mask layer becomes poor. This is because the polymer formation is proportional to the photoresist pattern area and the etching selectivity ratio increases with polymer formation. Further, the SAC pad has an upper surface size confined within the space between adjacent gate lines. This is because over-etching is generally performed after polysilicon CMP and thereby the top surface of resulting SAC pad is lower in level than that of the gate stack. This results in a narrow process margin of alignment between the SAC pad and later-formed bit line contact. Also, after conventional CMP process for electrical separation, over-etching process is generally conducted on the exposed layer of polysilicon, nitride, and oxide and thereby producing byproducts which must be eliminated by additional cleaning process.

SUMMARY OF THE INVENTION

The present invention is directed toward providing a method for forming a SAC pad in a semiconductor device which can prevent gate capping layer from being etched during SAC etching of an insulating layer and can increase top surface areas of the SAC pad for a wide process window.

A feature of the present invention is the formation of a merged SAC opening which exposes a plurality of contact areas of a semiconductor substrate. The merged SAC opening may expose a storage node contact area and a bit line contact area simultaneously. The SAC is opened by etching the insulating layer selectively with respect to the capping layer of the stacked gate electrode and sidewall spacer. Such merged SAC pattern is advantageously formed in order to increase etching selectivity during SAC etching and provide a large process window.

Another feature of the present invention is performing etching back technique for the purpose of electrical separation of each SAC pads unlike conventional CMP technique. The etching back technique uses a gas chemistry based on fluorine and carbon. More specifically, etching back technique includes first step of etching the SAC composing material down to underlying the insulating layer. First step etching back uses a mixed gas containing $SF_6$, $CF_4$ and $CHF_3$. Second step of etching back is conducted on the conductive material and the insulating layer down to a top surface of the capping layer by using a mixed gas containing $SF_6$, $CF_4$ and $CHF_3$. Third step of etching back is conducted on the capping layer selectively with respect to the conductive material by using a mixed gas containing $CF_4$ and $CHF_3$.

These and other features are provided, according to the present invention, by forming gate electrode layers of a polysilicon and a metal silicide such as tungsten silicide layer on a semiconductor substrate. Gate capping layers of a nitride layer and an oxide layer are deposited on the gate electrode layers. Through photographic process, selected portions of the deposited layers are etched to form spaced apart gate electrode structures. Sidewall spacers are then formed on sidewalls of the gate electrode structures by the process of depositing a material layer and etching back thereof. The material for sidewall spacer comprises a silicon nitride layer.

An insulating layer composed of an oxide is then deposited to completely cover the gate structures, filling spaces between adjacent gate structures. The insulating layer comprises borophosphosilicate glass(BPSG) oxide, undoped silicate glass(USG) oxide and high density plasma(HDP) oxide.

Using a contact pad formation mask, selected portions of the oxide insulating layer are etched selectively with respect to nitride of capping layer and spacer and thereby to form SAC openings to the substrate. Both storage node and bit line contact areas of the substrate are simultaneously exposed by single SAC opening for the purpose of a wide process window.

A conductive material is then deposited in the SAC openings and on the oxide insulating layer. The conductive material is made of a material that has an etching selectivity with respect to nitride. For electrical separation each SAC pad from one another, etching back process is carried out on the conductive material and the insulating layer down to a top surface of the capping layer. At the end of the etching back process, a top portion of the capping layer is selectively etched with respect to the conductive material and SAC pads are formed.

Subsequently, bit line and capacitor are formed to be electrically connected to the corresponding SAC pads through contact plugs formed in selected portions of insulating layer.

BRIEF DESCRIPTION OF THE DRAWINGS

The invention may be understood and its objects will become apparent to those skilled in the art by reference to the accompanying drawings as follows.

DETAILED DESCRIPTION OF THE PREFERRED EMBODIMENTS

Figure 1:
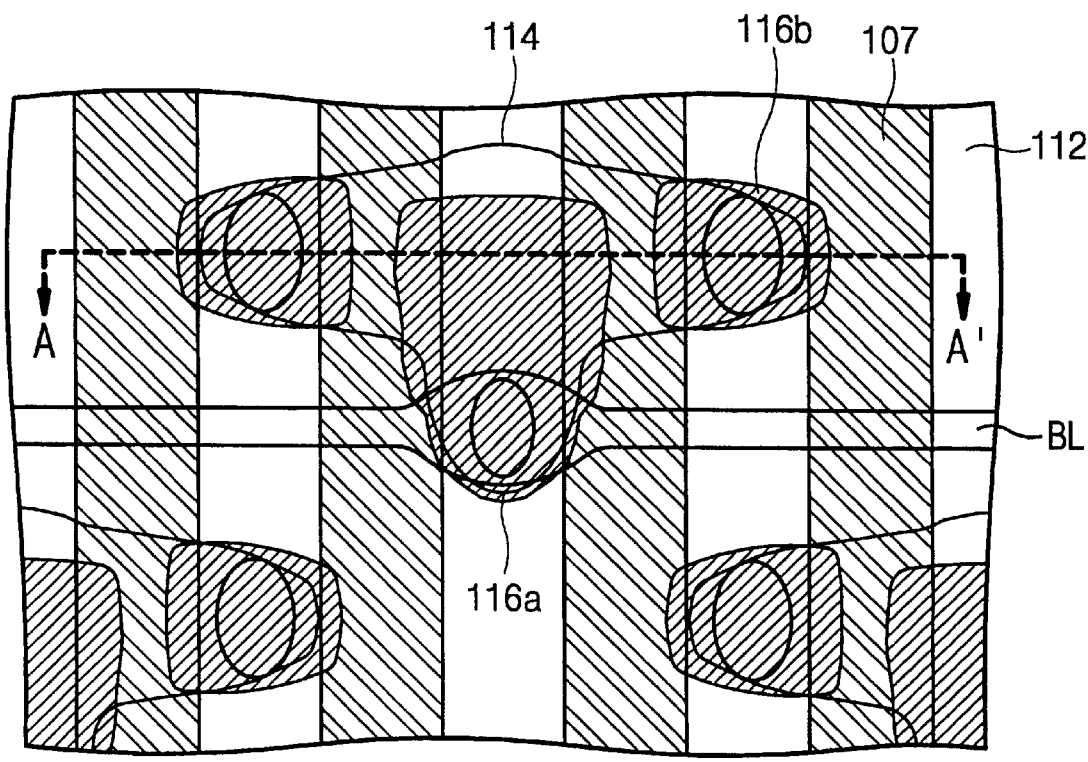
FIG. 1 is a top plan view schematically showing SAC pad structures according to the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervening layers may also be present. Moreover, each embodiment described and illustrated herein includes its complementary conductivity type embodiment as well.

The preferred embodiment of the present invention will now be described with reference to the accompanying drawings, FIG. 1 and FIGS. 2A to 2F. FIG. 1 is a top plan view showing SAC pad structure and FIGS. 2A to 2F are cross-sectional views at selected stages of a process for forming SAC pads, taken along line A–A' of FIG. 1.

For better understanding of present invention, FIG. 1 and FIG. 2 are concurrently referred by following description thereof. Referring now to FIG. 2A, a device isolation layer 102 is formed at a predetermined region of a semiconductor substrate 100 to define an active region 101 to which electrical connection is to be made. The device isolation layer 102 is formed by any suitable method such as shallow trench isolation technique and local oxidation of silicon technique.

A gate oxide layer(not shown in the drawings), gate electrode layers 103 and 104 and gate capping layers 105 are sequentially deposited. Through conventional photo-etching process, deposited layers are patterned to form spaced apart gate electrode structures 107. Impurity ions implantation is conventionally performed for a source/drain formation. A sidewall spacer 108 is formed on lateral edges of the gate electrode structures 107 by the process of depositing a silicon nitride layer on the gate electrode structure 107 and on the substrate 100 and then etching back thereof As a result, gate structures are completed.

More specifically, the gate electrode layers are made of a double layer of a polysilicon 103 and a metal silicide 104 such as tungsten silicide. Also, a multilayer of combination thereof can be employed. In case of the double layer, the polysilicon and tungsten silicide layer are formed to a thickness of about 1,000 Å, respectively. The capping layers are made of a double layer structure of a nitride layer 105 and an oxide layer 106 thereon. Also, a multilayer structure of combination thereof can be employed. In case of the double layer structure, the nitride layer 105 is formed to a thickness of about 1,000 Å to 2,000 Å and the oxide layer 106 is formed to a thickness of about 300 Å to 1,000 Å.

The sidewall spacer is formed to a thickness of about 300 Å to 1,000 Å and preferably to a thickness of about 500 Å.

Figure 2A:
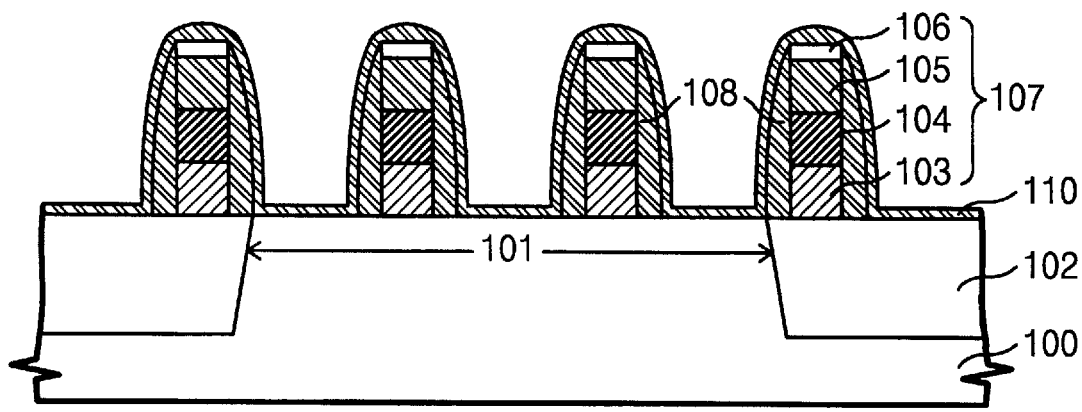
FIGS. 2A to 2F are flow diagrams showing a method of forming SAC pads, which are cross-sectional views taken along line A–A' of FIG. 1.

An etching stopper layer 110 is deposited on the entire surface of the substrates 100, following the topology of the gate structures, as illustrated in FIG. 2A. The etching stopper layer 110 is made of a silicon nitride layer and has a thickness of about 50 Å to 200 Å. During SAC etching, the etching stopper layer 110 protects the substrate surface and the gate electrode layer together with capping layer and sidewall spacer.

Figure 2B:
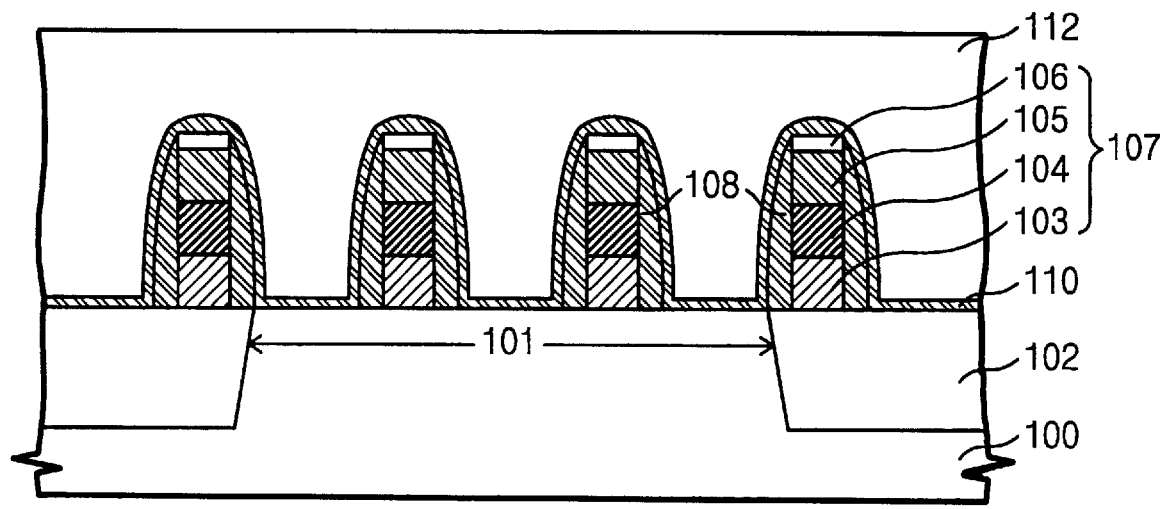

Referring now to FIG. 2B, an interlayer insulating layer 112 is deposited on resulting structure to cover the gate structures, completely filling spaces between adjacent gate structures. The insulating layer 112 is made of a material that has an etching selectivity with respect to nitride of etching stopper, capping layer and spacer. Preferably, oxide layer is formed as the insulating layer 112. The oxide layer 112 comprises borophosphosilicate glass(BPSG), undoped silicate glass(USG) and high density plasma(HDP). The insulating layer is formed to a thickness of about 3,500 Å to 5,500 Å. In order to obtain wide process windows of photographic process, the top surface of the insulating layer is planarized by removing a partial thickness thereof and leaving about 500 Å to 1,000 Å on the gate structures.

Figure 2C:
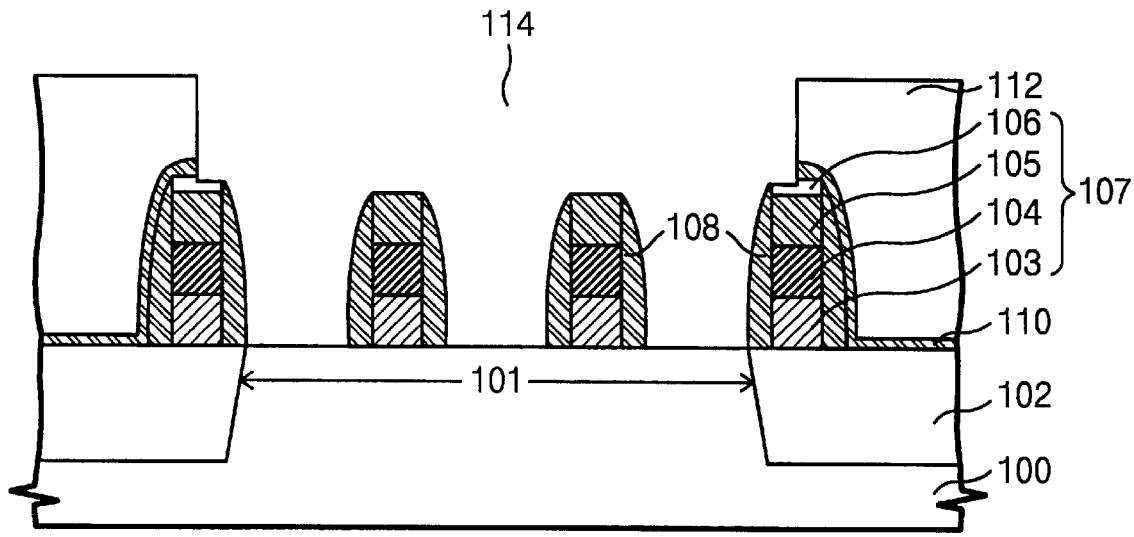

SAC pattern(not shown) is then formed on the planarized insulating layer 112. The SAC pattern resembles "T" shape and is made of a photoresist layer. Using this SAC pattern, exposed oxide interlayer insulating layer 112 is anisotropically etched selectively with respect to silicon nitride of etching stopper 110. After that, the etching stopper layer is removed by wet etching and thereby forming a SAC opening 114 as shown in FIG. 2C. The resulting "T" shaped SAC opening 114 exposes both storage node contact and bit line contact areas of the substrate(see FIG. 1). Such SAC pattern can provide a wide process window of photographic process and also good etching selectivity between oxide layer 112 and nitride layer 110 during SAC etching.

Figure 2D:
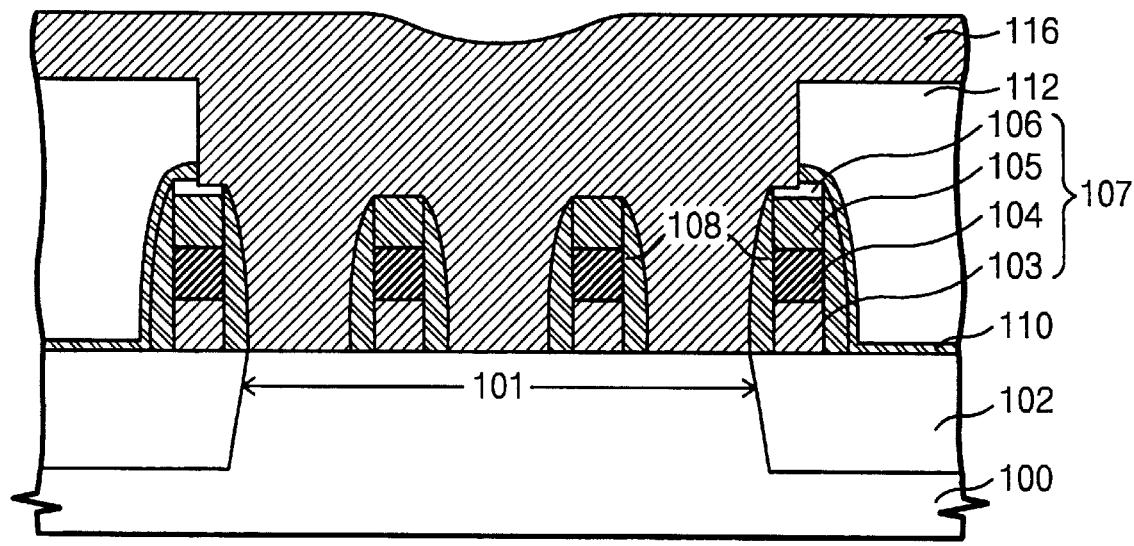

Referring now to FIG. 2D, a conductive material layer 116 that has etching selectivity with respect to the nitride layer is deposited on the insulating layer 112 to fill the SAC opening 114. For example, polysilicon is deposited to a thickness of about 3,500 Å to 5,000 Å.

Next process sequence is the formation of SAC pads electrically separated from each other by the process of etching back, unlike conventional first CMP and final over-etching process. Three steps of etching back process are carried out in this method. First one is etching back the polysilicon layer using the oxide insulating layer as end point. This end point detecting etching back of the polysilicon with respect to oxide layer uses a mixed gas containing $SF_6$ and $CF_4$.

Second one is simultaneously etching back the polysilicon and oxide using a mixed gas containing $SF_6$, $CF_4$ and $CHF_3$. This simultaneous etching back of polysilicon and oxide is carefully controlled(i.e., timed etching) and stopped at close to a top surface of the capping layer. For example, if the thickness over the gate capping layer is about 1,000 Å to 1,500 Å timed etching back is carried out for about 40 seconds.

Final one is selectively etching back a portion of the nitride layer of the capping layer with respect to polysilicon. This selective etching back nitride layer is carefully controlled such that has an etching rate of about 2:1 to 4:1 with respect to polysilicon and etches a partial thickness of the nitride layer corresponding to one-third of initial thickness. More specifically, this etching back uses a mixed gas containing $CF_4$ and $CHF_3$.

Above-mentioned etching back processes are performed in a single chamber, namely, in-situ process, while changing etching gas required to each etching back process. Accordingly, compared with conventional CMP process, it has advantages of low fabrication cost and fabrication simplicity. Further more, the top surface of the SAC pad can be increased by etching a partial thickness of the nitride capping layer as compared to conventional SAC pad by over-etching process. Accordingly, there are sufficient room for alignment margin between the SAC pad and the later-formed bit line storage node.

Figure 2E:
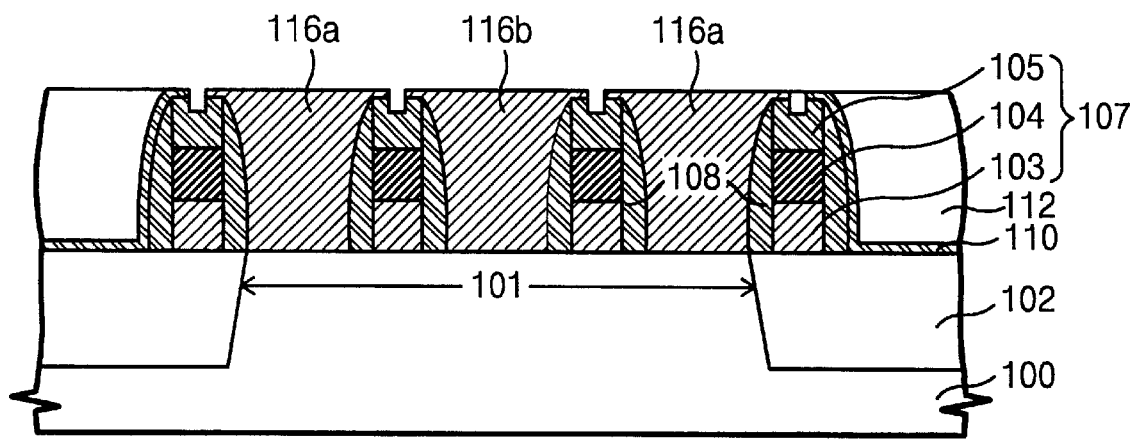

From above-mentioned etching back processes, SAC pads are formed as shown in FIG. 2E. The resulting SAC pads include both storage node SAC pads 116a and bit line SAC pad 116b.

Figure 2F:
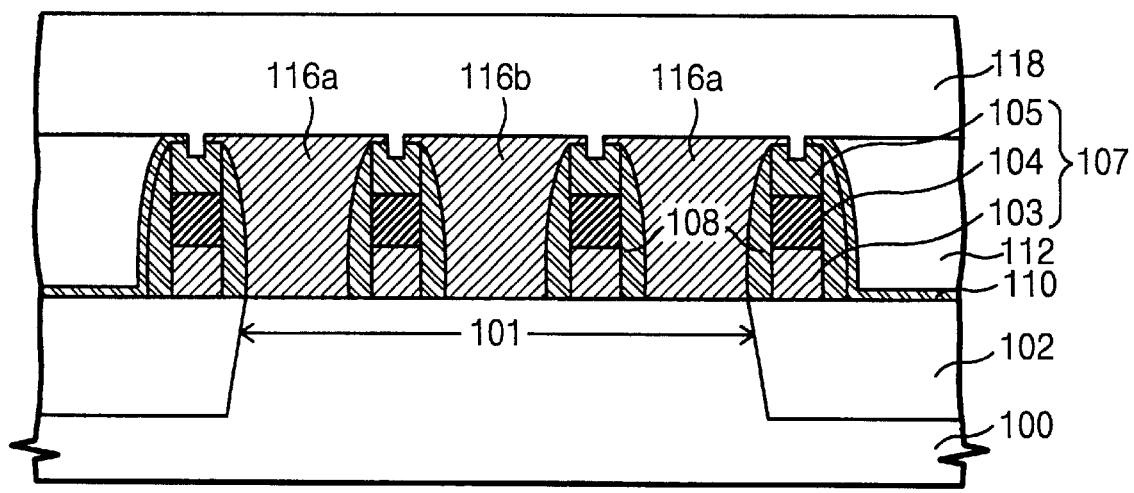

Another insulating layer 118 is deposited on the resulting structure. For example, as illustrated by FIG. 2F, USG oxide layer or PE-TEOS oxide layer is deposited to a thickness of about 1,000 Å to 3,000 Å. Subsequently bit lines are conventionally formed on the another insulating layer 118 to be electrically connected to the bit line SAC pad 116b. In succession, storage nodes are formed to be electrically connected to the storage node SAC pads 116a.

What is claimed is:

1. A method of forming an integrated circuit structure, comprising the steps of:

forming first and second spaced-apart electrically conductive lines that each comprise an electrically insulating capping layer, on a semiconductor substrate;

forming an electrically insulating layer having an opening therein that exposes the semiconductor substrate and the first and second electrically conductive lines, on the semiconductor substrate; then forming an electrically conductive layer that covers and extends between the first and second electrically conductive lines and electrically contacts the semiconductor substrate, in the opening;

simultaneously etching back the electrically conductive layer and the electrically insulating layer using a first etchant that selectively etches the electrically conductive layer at a first rate and the electrically insulating layer at a second rate less than the first rate; and forming first and second contact pads that electrically contact the semiconductor substrate, are self-aligned to the first and second electrically conductive lines, respectively, and are electrically isolated from each other, by selectively etching the electrically conductive layer at a third rate while simultaneously etching the capping layers associated with the first and second electrically conductive lines at a fourth rate greater than the third rate.

2. The method of claim 1, wherein the fourth rate is greater than the third rate by a factor in a range between about 2 and 4.

3. The method of claim 1, wherein said step of simultaneously etching back the electrically conductive layer comprises exposing the electrically conductive layer and the electrically insulating layer to an initial etching solution comprising $SF_6$ and $CF_4$; and wherein said step of forming first and second contact pads comprises exposing the electrically conductive layer and the capping layers associated with the first and second electrically conductive lines to a final etching solution comprising $CF_4$ and $CHF_3$.

4. The method of claim 3, wherein the initial etching solution does not comprise $CHF_3$; and wherein the final etching solution does not comprise $SF_6$.

5. The method of claim 3, wherein said step of simultaneously etching back the electrically conductive layer is followed by the step of etching the electrically conductive layer and the electrically insulating layer simultaneously using an intermediate etching solution comprising $SF_6$, $CF_4$ and $CHF_3$.

6. The method of claim 4, wherein said step of simultaneously etching back the electrically conductive layer is followed by the step of etching the electrically conductive layer and the electrically insulating layer simultaneously using an intermediate etching solution comprising $SF_6$, $CF_4$ and $CHF_3$.

7. The method of claim 6, wherein said steps of simultaneously etching back the electrically conductive layer, etching the electrically conductive layer and the electrically insulating layer simultaneously using an intermediate etching solution, and forming first and second contact pads are performed in sequence during an etching time interval by exposing the electrically conductive layer, the electrically insulating layer and the capping layers associated with the first and second conductive lines to an etching solution that varies in composition and comprises $SF_6$ and $CF_4$ but no $CHF_3$ at the commencement of the etching time interval and comprises $CF_4$ and $CHF_3$ but no $SF_6$ at the end of the etching time interval.

8. The method of claim 7, wherein the fourth rate is greater than the third rate by a factor in a range between about 2 and 4.

* * * * *